(12) United States Patent
Morozumi et al.

(10) Patent No.: US 10,461,012 B2
(45) Date of Patent: Oct. 29, 2019

(54) SEMICONDUCTOR MODULE WITH REINFORCING BOARD

(71) Applicant: FUJI ELECTRIC CO., LTD., Kawasaki-shi (JP)

(72) Inventors: Akira Morozumi, Okaya (JP); Hiromichi Gohara, Matsumoto (JP); Takafumi Yamada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/066,458

(22) Filed: Mar. 10, 2016

(65) Prior Publication Data
US 2016/0190033 A1 Jun. 30, 2016

Related U.S. Application Data

(63) Continuation of application No. PCT/JP2015/052274, filed on Jan. 28, 2015.

(30) Foreign Application Priority Data

Mar. 19, 2014 (JP) .................. 2014-056513

(51) Int. Cl.
*H01L 23/367* (2006.01)
*H01L 23/498* (2006.01)
(Continued)

(52) U.S. Cl.
CPC ........ *H01L 23/3675* (2013.01); *B23K 1/0012* (2013.01); *B23K 1/0016* (2013.01);
(Continued)

(58) Field of Classification Search
CPC . H01L 23/34; H01L 23/3675; H01L 23/3677; H01L 23/3735; H01L 23/3736;
(Continued)

(56) References Cited

U.S. PATENT DOCUMENTS 4,561,011 A * 12/1985 Kohara ................. H01L 23/367
174/16.3
5,703,399 A * 12/1997 Majumdar ............ H01L 21/565
257/675
(Continued)

FOREIGN PATENT DOCUMENTS

CN 101794754 A 8/2010
CN 102487053 A 6/2012
(Continued)

OTHER PUBLICATIONS

PCT, "International Search Report for International Application No. PCT/JP2015/052274".
(Continued)

*Primary Examiner* — Matthew L Reames
*Assistant Examiner* — John A Bodnar
(74) *Attorney, Agent, or Firm* — Manabu Kanesaka

(57) ABSTRACT

A semiconductor module includes a semiconductor chip; an insulating circuit board that has on one of principal surfaces of an insulating substrate a circuit member electrically connected to the semiconductor chip, and a first metal member disposed in the other principal surface of the insulating substrate; a second metal member that is disposed on a side of an outer edge of the first metal member and is at least partially disposed further toward an outer side than the insulating substrate; a molding resin portion that seals the semiconductor chip, the insulating circuit board, and the second metal member such that a portion of the first metal member and a portion of the second metal member are exposed; a cooler; a first bonding member that bonds the cooler and the first metal member; and a second bonding member that bonds the cooler and the second metal member.

13 Claims, 8 Drawing Sheets

(51) Int. Cl.
*H01L 23/31* (2006.01)
*H01L 23/29* (2006.01)
*H01L 23/373* (2006.01)
*H01L 23/473* (2006.01)
*B23K 1/00* (2006.01)
*H01L 23/433* (2006.01)
*H01L 23/00* (2006.01)
*B23K 101/14* (2006.01)
*B23K 101/40* (2006.01)
*H01L 23/16* (2006.01)

(52) U.S. Cl.
CPC ........ *H01L 23/293* (2013.01); *H01L 23/3121* (2013.01); *H01L 23/3735* (2013.01); *H01L 23/3736* (2013.01); *H01L 23/4334* (2013.01); *H01L 23/473* (2013.01); *H01L 23/49838* (2013.01); *H01L 24/34* (2013.01); *H01L 24/37* (2013.01); *B23K 2101/14* (2018.08); *B23K 2101/40* (2018.08); *H01L 23/16* (2013.01); *H01L 23/49811* (2013.01); *H01L 23/49861* (2013.01); *H01L 2224/37599* (2013.01); *H01L 2224/83801* (2013.01); *H01L 2224/84801* (2013.01); *H01L 2924/00014* (2013.01); *H01L 2924/13055* (2013.01); *H01L 2924/13091* (2013.01); *H01L 2924/181* (2013.01)

(58) Field of Classification Search
CPC ............. H01L 23/49861; H01L 23/433; H01L 23/4334; H01L 23/16; H01L 23/24; H01L 2924/15787; B23K 1/0012; B23K 2201/14; B23K 2201/40; H05K 1/0204; H05K 1/021
See application file for complete search history.

(56) References Cited

U.S. PATENT DOCUMENTS

| | | | | |
|---|---|---|---|---|
| 5,886,408 | A * | 3/1999 | Ohki | H01L 23/16 257/705 |
| 6,483,706 | B2 * | 11/2002 | Vinciarelli | H01L 23/3735 174/16.3 |
| 7,169,643 | B1 * | 1/2007 | Hashimoto | H01L 21/4871 257/E23.065 |
| 8,283,773 | B2 | 10/2012 | Mori et al. | |
| 8,502,363 | B2 | 8/2013 | Chiang et al. | |
| 8,986,806 | B1 * | 3/2015 | Baloglu | H01L 23/562 257/433 |
| 2001/0008703 | A1 * | 7/2001 | Sakata | C22C 1/045 428/546 |
| 2008/0217753 | A1 * | 9/2008 | Otani | H01L 21/565 257/690 |
| 2008/0268632 | A1 * | 10/2008 | Luh | H01L 33/40 438/612 |
| 2010/0193941 | A1 * | 8/2010 | Mori | H01L 23/3735 257/712 |
| 2011/0059581 | A1 | 3/2011 | Horio et al. | |
| 2012/0018871 | A1 | 1/2012 | Lee et al. | |
| 2012/0138946 | A1 | 6/2012 | Kikuchi et al. | |
| 2012/0152510 | A1 | 6/2012 | Noda et al. | |
| 2013/0049186 | A1 | 2/2013 | Miyamoto et al. | |
| 2013/0134572 | A1 * | 5/2013 | Lenniger | H01L 23/367 257/690 |
| 2014/0264799 | A1 * | 9/2014 | Gowda | H01L 23/3677 257/675 |
| 2014/0264800 | A1 * | 9/2014 | Gowda | H01L 24/83 257/675 |

FOREIGN PATENT DOCUMENTS

| | | |
|---|---|---|
| CN | 103367288 A | 10/2013 |
| JP | 2013-046016 A | 8/2011 |
| JP | 2012-142521 A | 7/2012 |
| JP | 2012-142547 A | 7/2012 |
| JP | 2013-110181 A | 6/2013 |
| JP | 2014-183058 A | 9/2014 |

OTHER PUBLICATIONS

Japan Patent Office, "Office Action for Japanese Patent Application No. 2016-508569," Sep. 12, 2017.
China Patent Office, "Office Action for Chinese Patent Application No. 201580001835.1," Oct. 16, 2017.
China Patent Office, "Office Action for Chinese Patent Application No. 201580001835.1," Jan. 9, 2019.

* cited by examiner

SEMICONDUCTOR MODULE WITH REINFORCING BOARD

CROSS-REFERENCE TO RELATED APPLICATION

This is a continuation application of PCT/JP2015/052274 filed on Jan. 28, 2015 claiming priority of Japanese Patent Application No. 2014-056513 filed on Mar. 19, 2014, the disclosure of which is incorporated herein.

TECHNICAL FIELD

The present invention relates to a semiconductor module with a reinforcing board in which the reinforcing board is sandwiched between the semiconductor module unit and a cooler.

BACKGROUND ART

A power semiconductor module unit has a structure in which a power semiconductor chip such as an IGBT (insulated gate bipolar transistor), a MOSFET (metal oxide semiconductor field effect transistor), or a FWD (free wheeling diode) is solder-bonded to an insulating circuit board having a predetermined circuit, and the power semiconductor chip and the insulating circuit board are sealed by a resin. Such a power semiconductor module unit is used for controlling large current in electric automobiles, electric railroad vehicles, machining tools, and the like, for example. Since a power semiconductor chip in which large current flows radiates a large amount of heat, the semiconductor module unit requires a structure capable of efficiently radiating heat in order to realize a compact outer shape. Moreover, practically, the semiconductor module unit is used in a state of being attached to a cooler in order to further improve the heat radiating performance. In the following description, a structure in which a semiconductor module unit is attached to a cooler will be referred to as a semiconductor module.

Conventionally, in order to radiate heat efficiently, an insulating circuit board in which a plurality of power semiconductor chips which is a heat generation source is solder-bonded is solder-bonded to a metal substrate of copper or the like having an excellent heat conducting property (heat radiation performance). Further, the rear surface of the metal substrate is close-contacted with the cooler with heat-radiating grease interposed and is fixed to the cooler by bolts and nuts inserted through holes formed in the periphery of the metal substrate (Patent Literature 1).

Moreover, the operation of fixing the semiconductor module unit to the cooler is generally performed by the user of the semiconductor module unit. In general, many heat-radiation metal substrates use copper or copper alloys as the main material thereof, and many coolers use aluminum or aluminum alloys as the main material thereof. The heat conductivities of copper and aluminum are approximately 390 W/m·K and approximately 220 W/m·K, respectively. In contrast, since the heat conductivity of heat-radiating grease is as small as approximately 1.0 W/m·K, the heat-radiating grease serves as a large heat resistance component in relation to heat radiation of power semiconductor modules. Thus, the temperature of semiconductor chips is likely to increase, and accordingly, the allowable current capacity decreases.

Recently, there is an increasing interest in energy-saving and clean energy techniques, and wind power generation and electric automobiles are the leading techniques in the market. A power semiconductor module used in these uses handles large current and needs to transfer heat energy generated by power semiconductor chips to a cooler with high efficiency as much as possible to radiate heat to the outside in order to realize a compact outer shape. In particular, in electric automobile, a water cooling method is used as a cooling method in order to further reduce the size and weight. Moreover, a cooler-integrated semiconductor module has already been developed and used practically (Patent Literatures 2, 3, and 4). The cooler-integrated semiconductor module has a structure in which an insulating circuit board having semiconductor chips mounted thereon is directly bonded to the surface of a water-cooled cooler by eliminating the heat-radiating grease serving as a heat resistance component and a thick and heavy metal substrate having a large outer shape. As a method of directly bonding the insulating circuit board having semiconductor chips mounted thereon and the cooler, a bonding method which uses a solder material is generally used. A structure in which a resin frame that surrounds the periphery of the semiconductor chips and the insulating circuit board is fixed to the cooler using bolts is also known (Patent Literature 4).

Patent Literature 1: Japanese Patent Application Publication No. 2008-288414

Patent Literature 2: Japanese Patent Application Publication No. 2008-226920

Patent Literature 3: Japanese Patent Application Publication No. 2012-142465

Patent Literature 4: Japanese Patent Application Publication No. 2008-218814

However, in the method of directly solder-bonding the insulating circuit board having semiconductor chips mounted thereon and the cooler, in order to solder-bond the insulating circuit board to the cooler, it is necessary to heat the cooler having large heat capacity to a melting point (approximately 250° C. to 350° C.) or higher of the solder material. Thus, the time required for the soldering operation increases and the production efficiency decreases. Moreover, when the insulating circuit board is solder-bonded to the cooler using flux, it is necessary to rinse the flux adhering to the heavy and bulky cooler, and the operation efficiency decreases.

Further, after an insulating circuit board having a plurality of semiconductor chips mounted thereon is solder-bonded to a cooler, when the circuits on the semiconductor chips or the insulating circuit board are connected by wire bonding, it is necessary to perform the wire bonding operation in a state in which the cooler is bonded to the insulating circuit board. However, since propagation of ultrasound waves required for realizing wire bonding connection is not likely to be sufficient, bonding defects may occur. Further, if the ultrasound wave power is increased to avoid the bonding defects, the damage to the semiconductor chips may increase.

As described above, the structure in which, after the insulating circuit board is directly bonded to the cooler by eliminating the heat-radiating grease and the heat-radiation metal substrate, the semiconductor chips are bonded to the insulating circuit board in order to reduce the size and weight of the semiconductor module has a problem that the yield rate may decrease and the assembling cost may increase.

Moreover, in a structure in which a resin-sealed semiconductor module unit with no heat-radiation metal substrate is manufactured, and the semiconductor module unit is directly solder-bonded to a cooler to form a semiconductor module, a metal surface on the rear surface of an insulating circuit board exposed to a portion of the bottom surface of the semiconductor module unit is solder-bonded to the surface of the cooler. The area of the soldered portion contacting the cooler, on the bottom surface of the semiconductor module unit is smaller than that of the heat-radiation metal substrate, and the resin portion around the bonding portion is not attached to the cooler. Thus, deterioration is likely to progress from the periphery of the solder bonding portion.

Moreover, since the structure in which the resin frame surrounding the periphery of the semiconductor chips and the insulating circuit board is fixed to the cooler by bolts requires a bolt fastening operation, the assembling cost may increase.

Disclosure of the Invention

An object of the present invention is to provide a semiconductor module unit which is small and light in size, has excellent heat radiation performance, and provides a high yield rate, and which is easy to assemble, and to provide a semiconductor module in which the semiconductor module unit is integrated with a cooler.

In order to attain the object, a semiconductor module according to the present invention includes a semiconductor element; an insulating circuit board that has on one principal surface of an insulating substrate a circuit member electrically connected to the semiconductor element, and a first metal member disposed on the other principal surface of the insulating substrate; a second metal member that is disposed on a side of an outer edge of the first metal member and is at least partially disposed further toward an outer side than the insulating substrate; a molding resin portion that seals the semiconductor element, the insulating circuit board, and the second metal member in a state in which a portion of the first metal member and a portion of the second metal member are exposed; a cooler; a first bonding member that bonds the cooler and the first metal member; and a second bonding member that bonds the cooler and the second metal member.

According to the present invention, it is possible to provide a semiconductor module unit which is small and light in size, exhibits excellent heat radiation performance, a high yield rate, and which is easy to assemble, and to provide a semiconductor module in which the semiconductor module unit is integrated with a cooler.

In the semiconductor module of the present invention, the first metal member and the second metal member are preferably separated from each other.

According to this configuration, a crack in the second bonding member rarely propagates to the first bonding material separated from the second bonding member and a bonding portion having excellent mechanical strength can be formed.

Alternatively, in the semiconductor module of the present invention, a boundary of the first bonding member and a boundary of the second bonding member are preferably connected on a principal surface of the cooler.

According to this configuration, since the bonding area can be extended as much as possible, it is possible to strengthen the bonding between the first and second metal members and the cooler.

Alternatively, in the semiconductor module of the present invention, the second metal member preferably covers at least a portion of a side surface of the molding resin portion.

According to this configuration, the area of the portion of the second metal member close-contacting the molding resin portion increases, and the effect of reinforcing the portion bonded to the cooler and reinforcing the outer shape of the molding resin portion can be obtained.

In the semiconductor module of the present invention, the second metal member preferably has a frame shape that reinforces an outer shape of the molding resin portion.

According to this configuration, since the second metal member is disposed in each side of the molding resin portion, deformation of the outer shape of the molding resin portion can be suppressed.

In the semiconductor module of the present invention, an uneven surface is preferably provided on a surface of the second metal member being contacting the molding resin portion.

According to this configuration, it is possible to enhance the adhesion strength between the second metal member and the molding resin portion.

In the semiconductor module of the present invention, the first bonding member and the second bonding member are preferably metal bonding materials that do not contain lead.

According to this configuration, it is possible to provide an environmentally friendly lead-free semiconductor module.

In the semiconductor module of the present invention, the first bonding member and the second bonding member are preferably metal bonding materials that do not contain lead and have different compositions.

According to this configuration, it is possible to select compositions appropriately for the bonding position and to realize bonding with excellent cooling performance at a low cost.

In the semiconductor module of the present invention, an uneven surface is preferably formed on a surface of the second metal member contacting the second bonding member.

According to this configuration, it is possible to improve the bonding strength between the second metal member and the second bonding member.

In the semiconductor module of the present invention, the first bonding member is preferably a metal bonding material that does not contain lead and the second bonding member is preferably a thermoplastic resin or a thermosetting resin.

According to this configuration, since the second bonding member is a thermoplastic resin or a thermosetting resin, a creep deformation is more likely to occur than a bonding member formed of a metal material like solder. Thus, the second bonding member is rarely broken.

In the semiconductor module of the present invention, the first bonding member is preferably a member in which silver particles are sintered.

According to this configuration, heat conductivity increases and the cooling efficiency increases.

In the semiconductor module of the present invention, at least one metal layer, selected from a nickel-plating layer, a gold-plating layer, a silver-plating layer, a tin-plating layer, and a copper-plating layer, is preferably provided on a surface of the second metal member contacting the second bonding member.

According to this configuration, it is possible to improve the bonding strength between the second metal member and the second bonding member.

In the semiconductor module of the present invention, at least one metal layer, selected from a nickel-plating layer, a gold-plating layer, a silver-plating layer, a tin-plating layer, and a copper-plating layer, is preferably provided on a surface of the cooler contacting the second bonding member.

According to this configuration, it is possible to improve the bonding strength between the cooler and the second bonding member.

In the semiconductor module of the present invention, at least one metal layer selected from a gold-plating layer and a silver-plating layer is preferably provided in a portion of the cooler contacting the first bonding member and a portion of the first metal member contacting the first bonding member.

According to this configuration, it is possible to improve the performance of transferring heat from the first metal member to the cooler.

In the semiconductor module of the present invention, the insulating substrate is preferably a ceramic board mainly formed of at least one ceramic material selected from aluminum oxides, silicon nitrides, and aluminum nitrides.

According to this configuration, since the heat conductivity of the insulating substrate is high, the heat radiation performance can be improved. When the heat radiation performance can be improved, since the semiconductor element can be operated at a higher temperature, it is possible to improve the output of the semiconductor element.

In the semiconductor module of the present invention, the second metal member is preferably mainly formed of at least one material selected from copper, copper alloys, aluminum, and aluminum alloys.

According to this configuration, it is possible to improve the heat conductivity of the second metal member.

A semiconductor module unit according to the present invention includes a semiconductor element; an insulating circuit board that has on one principal surface of an insulating substrate a circuit member electrically connected to the semiconductor element, and a first metal member disposed in the other principal surface of the insulating substrate; a second metal member that is disposed on a side of an outer edge of the first metal member and is at least partially disposed further toward an outer side than the insulating substrate; and a molding resin portion that seals the semiconductor element, the insulating circuit board, and the second metal member in a state in which a portion of the first metal member and a portion of the second metal member are exposed, wherein the first metal member and the second metal member are connected to the cooler.

According to this configuration, it is possible to easily manufacture a semiconductor module unit ideal for connection to a cooler.

According to the present invention, it is possible to provide a semiconductor module unit which is small and light in size, has excellent heat radiation performance, and provides a high yield rate, and which is easy to assemble and to provide a semiconductor module in which the semiconductor module unit is integrated with the cooler.

EMBODIMENTS FOR CARRYING OUT THE INVENTION

Figure 1:
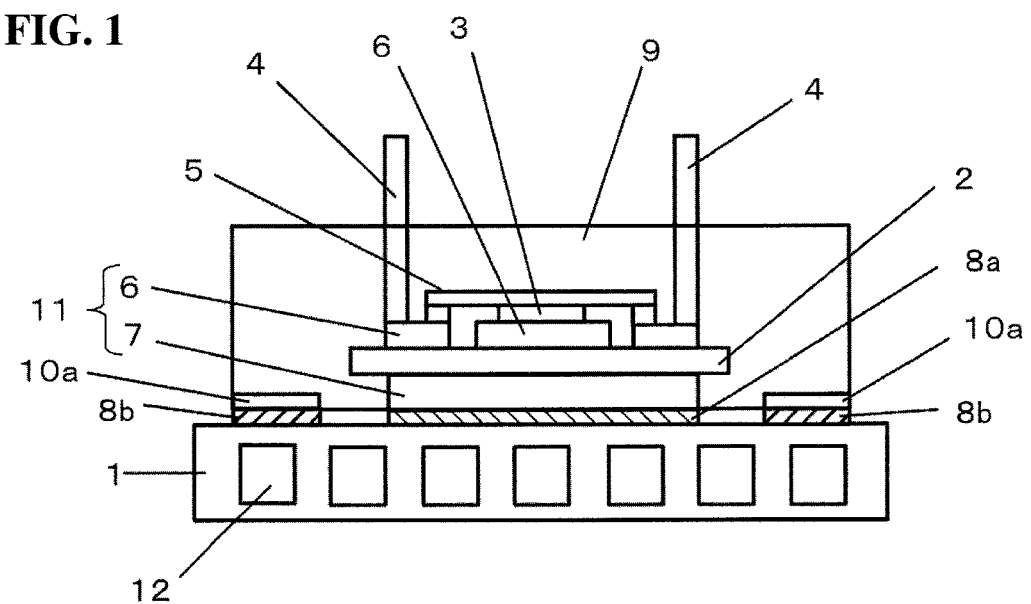
FIG. 1 is a cross-sectional view of a semiconductor module according to a first embodiment of the present invention.

Hereinafter, embodiments of a semiconductor module unit and a semiconductor module according to the present invention will be described in detail with reference to the drawings. In description of the embodiments and the accompanying drawings, the same elements are denoted by the same reference numerals, and redundant description thereof will not be provided. Moreover, in the accompanying drawings used in the following description, elements are not depicted in accurate scales and dimensional ratios for simplicity and clarity of illustration. Moreover, the present invention is not limited to the embodiments described below as long as it falls within the scope and spirit of the present invention.

First Embodiment

A first embodiment of a semiconductor module according to the present invention will be described in detail with reference to the cross-sectional view of FIG. 1. Moreover, the cross-sectional view of FIG. 2 illustrates a semiconductor module having a conventional structure illustrated so that the difference from the structure of the semiconductor module according to the first embodiment in FIG. 1 can be understood.

Figure 2:
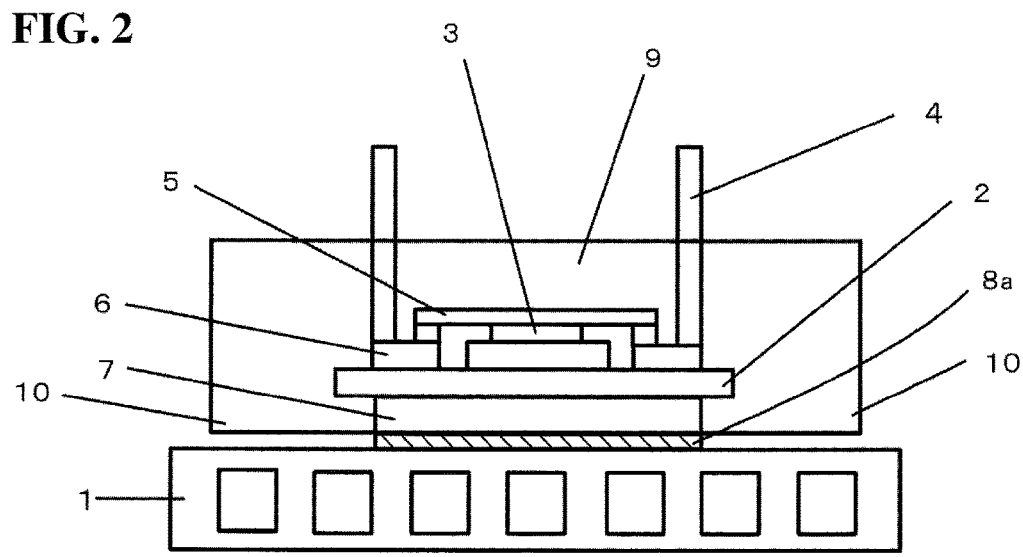
FIG. 2 is a cross-sectional view of a conventional semiconductor module.

In the semiconductor module of FIG. 1, a circuit copper foil 6 (circuit member) or the like is bonded to one of the principal surfaces of a ceramic board 2 (insulating substrate) mainly composed of AlN, $Si_3N_4$, or $Al_2O_3$, and a semiconductor element 3 is solder-bonded to a necessary position on the circuit copper foil 6. An electrode (not illustrated) on the upper surface of the semiconductor element 3 and external leadout terminals 4 provided on circuit copper foils 6 separated from the circuit copper foil 6 are connected by a lead frame 5, a bonding wire, or the like (however, a detailed connection relation is not illustrated in the drawing). A copper foil or copper board 7 (first metal member) is bonded to a lower surface of the ceramic board 2 so that an isolation distance from the circuit copper foil 6 on the upper surface is maintained by the ceramic board 2. An insulating circuit board 11 including the ceramic board 2, the circuit copper foil 6 on the upper surface, and the copper board 7 on the lower surface, the semiconductor element 3, the external leadout terminals 4, and the lead frame 5 are sealed by a molding resin. The external leadout terminals 4 are exposed from an upper portion of a molding resin portion 9, and the lower surface of the copper board 7 bonded to the lower surface of the insulating circuit board 11 is exposed from the lower portion of the molding resin portion 9.

Figure 7:
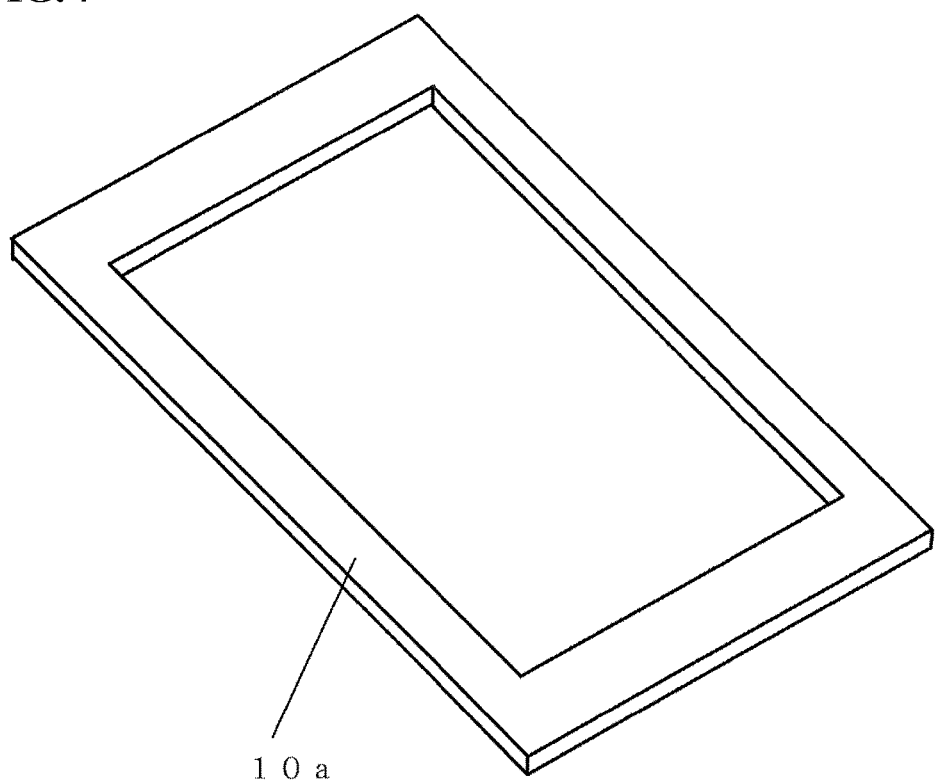
FIG. 7 is a perspective view of a reinforcing metal board according to the first embodiment of the present invention.

In the semiconductor module according to the first embodiment of the present invention, a planar reinforcing metal board 10a (second metal member) illustrated by the perspective view of FIG. 7 is disposed in a peripheral portion surrounding the copper board 7 exposed to the lower surface of the molding resin portion 9 so as to be separated from the copper board 7 in a planar direction thereof so that at least a lower surface thereof is exposed from the resin portion. Although the copper board 7 and the lower surface of the reinforcing metal board 10a are preferably flush with each other, the two boards may be shifted from the flush state as long as the shift can be adjusted by a bonding member used for bonding with a cooler 1 since the shift can be adjusted in accordance with the thickness of the bonding member. Moreover, the reinforcing metal board 10a illustrated in FIG. 7 may preferably have an uneven surface or a roughened surface on the inner surface of the reinforcing metal board that contacts the molding resin portion 9 in order to enhance adhesion strength.

The reinforcing metal board 10a is bonded to the upper surface of the cooler 1 by a second bonding member 8b when the copper board 7 on the rear surface of the insulating circuit board 11 is bonded to the upper surfaces of the reinforcing metal board 10a and the cooler 1 by a first bonding member 8a. The first and second bonding members 8a and 8b may be the same bonding member and may be different bonding members. The copper board 7 and the cooler 1 are preferably bonded by a metal bonding member from the viewpoint of a heat radiation performance. The reinforcing metal board 10a and the cooler 1 may be bonded by an organic adhesive as well as the metal bonding member. Examples of the organic adhesive include a thermoplastic resin or a thermosetting resin. According to such a configuration, since a creep deformation is more likely to occur than a bonding member formed of a metal material like solder, the second bonding member is rarely broken. The bonding using the reinforcing metal board 10a has an effect of reinforcing the bonding between the copper board 7 and the cooler 1. As a result, it is possible to solve the problem that deterioration of the solder bonding portion on the bottom surface of the conventional semiconductor module unit is remarkable. Further, the reinforcing metal board 10a has an effect of reinforcing the molding resin portion itself. The main component of the reinforcing metal board 10a and the cooler 1 preferably includes at least one material selected from copper, aluminum, a copper alloy, and an aluminum alloy.

Holes 12 through which coolant flows are formed in the cooler 1, and a coolant inlet and a coolant outlet (not illustrated) are formed. Coolant discharged from the coolant outlet is cooled by a heat exchanger outside the semiconductor module and the cooled coolant flows into the coolant inlet. A pump for pumping the coolant is provided in a pipeline for connecting the cooler and the heat exchanger.

A method of manufacturing the semiconductor module according to the first embodiment of the present invention will be described.

Figure 3:
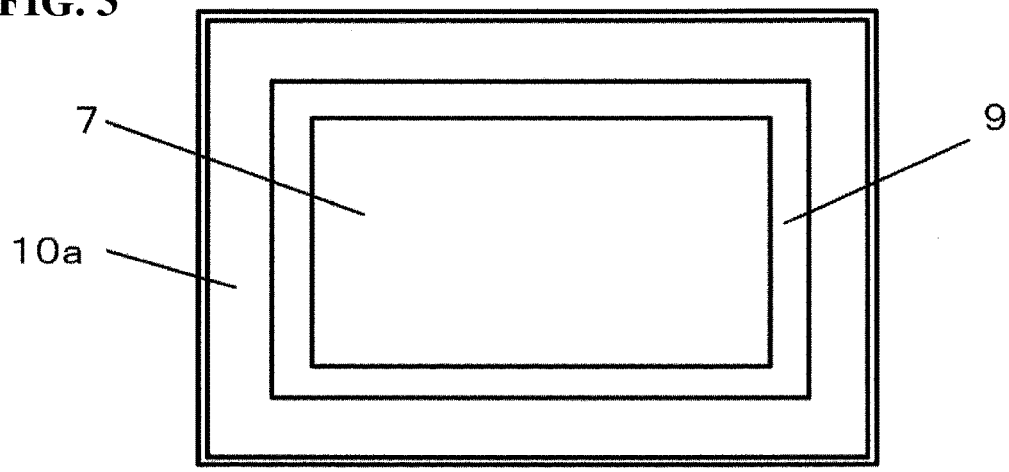
FIG. 3 is a plan view of a semiconductor module unit when seen from the rear surface.

First, a structure which includes the semiconductor chip 3 such as an IGBT semiconductor element or a FWD semiconductor element, the external leadout terminals 4, the lead frame 5, and the insulating circuit board 11 in which the circuit copper foil 6 (circuit member) and the copper board (first metal member) 7 are bonded to the upper and lower surfaces (front and rear surfaces) of the ceramic board 2 is manufactured. In this structure, the semiconductor chip 3 and the external leadout terminals 4 are soldered to the circuit copper foil 6 (circuit member), and the lead frame 5 is soldered to the surface electrode (not illustrated) of the semiconductor chip 3 and the circuit copper foil 6. Moreover, the 0.5 mm-thick planar reinforcing metal board 10a formed of copper is disposed on a surface of the structure to which the copper board 7 is exposed, and transfer molding is performed using a molding resin to form a semiconductor module unit. Alternatively, the structure may be disposed in a resin case in which the reinforcing metal board 10a is integrally molded, and a molding resin may be cast into the case to form a semiconductor module unit. The main component of the lead frame 5 preferably includes copper, and an epoxy-based resin, a silicon-based resin, a PPS (polyphenylene sulfide) resin, or the like is preferred as the molding resin. FIG. 3 is a plan view illustrating the copper board 7 on the rear surface of the insulating circuit board 11 of the semiconductor module unit after the resin sealing, and an exposed surface of the reinforcing metal board 10a. The molding resin portion 9 is exposed to the separation portion between the copper board 7 and the reinforcing metal board 10a.

Subsequently, both rear surfaces of the copper board 7 and the reinforcing metal board 10a of the semiconductor module unit and the upper surface (nickel-plating surface) of the cooler 1 mainly composed of an aluminum alloy are bonded using a bonding member.

The bonding member is preferably an environmentally friendly lead-free bonding member. Specifically, Sn—Sb solder is preferred.

Moreover, the bonding material used in the first bonding member and the material used in the second bonding member may have different compositions. The first bonding member preferably has high heat conductivity as well as physically strongly bonding the first metal member and the cooler and preferably formed of compositions in which a material having high heat conductivity such as silver is mixed. The second bonding member is expected to be capable of at least physically strongly bonding the first metal member and the cooler but may not be formed of a material having high heat conductivity, in particular. For example, solder that contains silver may be used for the first bonding member and solder that does not contain silver may be used for the second bonding member. By doing so, it is possible to obtain a required cooling performance and to reduce the cost.

A planar solder plate or a solder paste may be used as the form of the solder used in the bonding. The solder paste contains flux and has an advantage that the bonding temperature can be lowered as compared to that using a planar solder plate.

Sn—Sb solder-based bonding may be replaced with bonding which uses an Ag-sintered bonding member. According to this configuration, the heat conductivity is improved and the cooling efficiency increases.

At least one plating layer selected from a nickel-plating layer, a gold-plating layer, a silver-plating layer, a tin-plating layer, and a copper-plating layer is preferably formed on the upper surface of the cooler or the rear surface of the copper board 7 and the reinforcing metal board 10a. However, the practical melting point of a bonding member for bonding the semiconductor module unit and the cooler needs to be lower than the melting point of the solder bonding member in the semiconductor module unit. By doing so, the copper board 7 on the rear surface of the insulating circuit board 11 exposed to the rear surface of the semiconductor module unit and the reinforcing metal board 10a positioned on the periphery of the copper board 7 can be soldered to the cooler 1 without melting the portions which have been soldered.

Moreover, when the same bonding member is used as the first and second bonding members, a bonding member may be spread on the upper surface of the cooler 1 in a wide region extending across both regions of the exposed surfaces of the copper board 7 and the reinforcing metal board 10a, and then, the copper board 7 and the reinforcing metal board 10a may be bonded.

Figure 4:
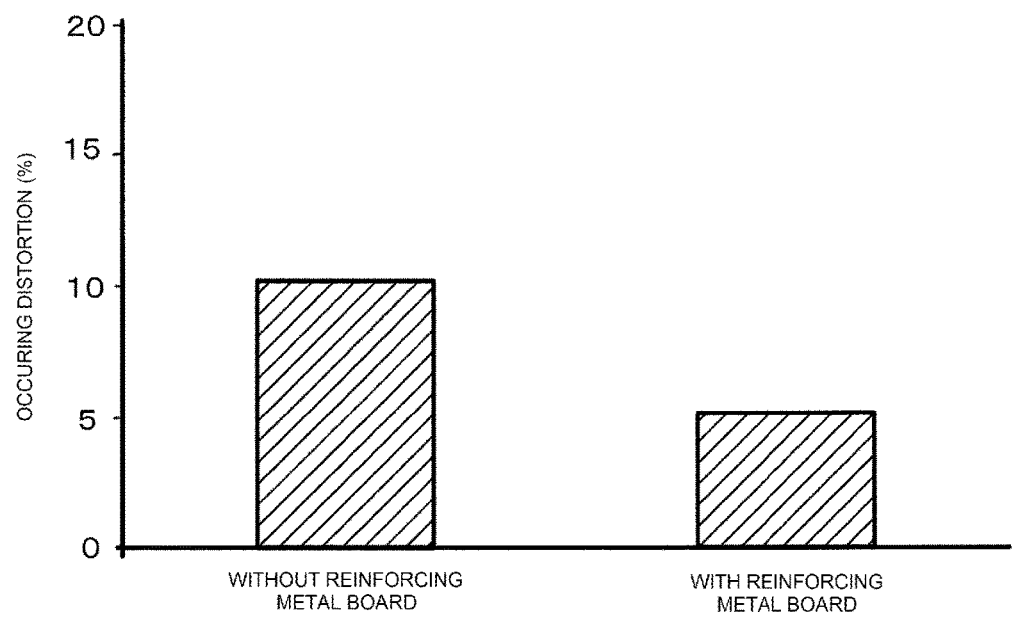
FIG. 4 is a bar graph illustrating the amount of distortion occurring in a solder bonding portion according to the first embodiment of the present invention.

Here, the effect of the reinforcing metal board 10a buried under the molding resin portion 9 on the periphery of the insulating circuit board 11 will be described. FIG. 4 illustrates a bar graph illustrating the magnitude of stress (distortion) occurring in the solder bonding portion between the semiconductor module unit and the cooler for the semiconductor module with the reinforcing metal board 10a according to the first embodiment of the present invention and the conventional semiconductor module without the reinforcing metal board. The stress (distortion) when the reinforcing metal board 10a is not present is approximately 10%, whereas the stress (distortion) when the reinforcing metal board 10a is present is approximately 5%. Thus, it can be understood that the occurring stress is reduced approximately by half in the semiconductor module of the present invention having the reinforcing metal board 10a. Thus, by burying the reinforcing metal board 10a, the occurring stress (distortion) can be reduced and the life of the solder bonding portion can be extended.

In the first embodiment, since the copper board (first metal member) 7 and the reinforcing metal board (second metal member) 10a are separated, even if a crack occurs in the second bonding member 8b under the reinforcing metal board (second metal member) 10a, the crack rarely propagates to the first bonding member 8a under the copper board (first metal member) 7. Moreover, even when stress occurs due to the difference between the thermal expansion coefficients of respective members resulting from the heat generated during operation of the semiconductor module and the stress acts to create a state in which a warp occurs in the insulating circuit board, it is possible to resist the warping stress by disposing the second metal member on the outer side than the lower surface of the molding resin portion so as to be bonded to the cooler.

Second Embodiment

Figure 5:
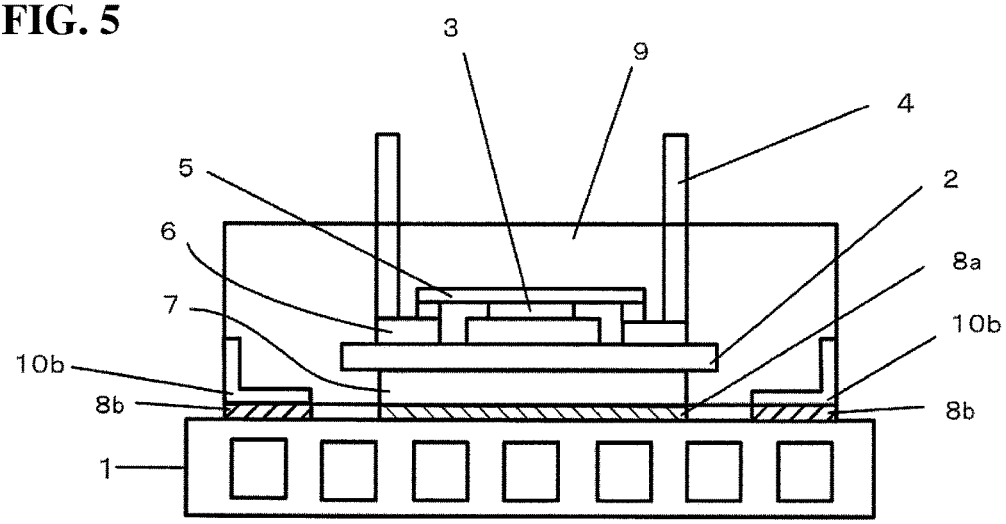
FIG. 5 is a cross-sectional view of a semiconductor module according to a second embodiment of the present invention.
Figure 8:
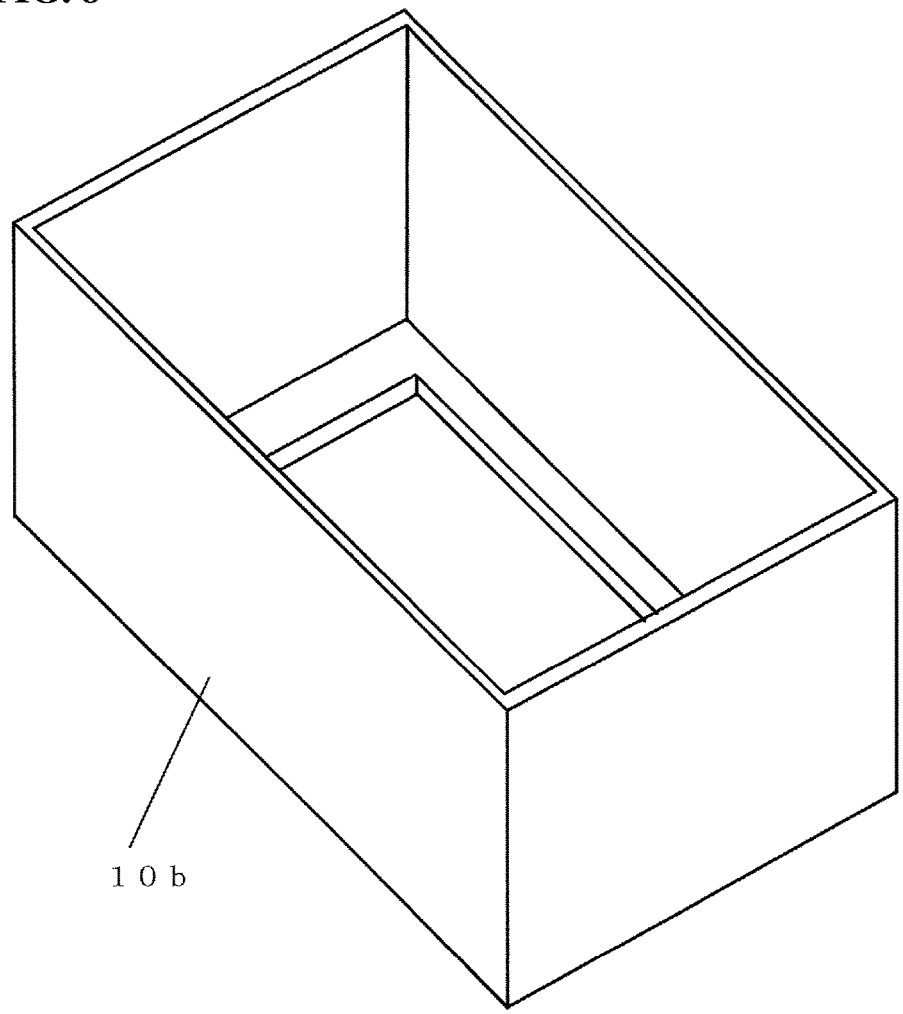
FIG. 8 is a perspective view illustrating an aspect of a reinforcing metal member according to the present invention.

A second embodiment of the semiconductor module of the present invention will be described in detail with reference to the cross-sectional view of FIG. 5. In the semiconductor module of the second embodiment, at least a portion of a side surface of the molding resin portion 9 of the semiconductor module unit is covered with a reinforcing metal member 10b. FIG. 8 illustrates the perspective view of the reinforcing metal member 10b. The reinforcing metal member 10b has a metal (copper) frame shape. When the reinforcing metal member 10b having such a shape is used, the area of the portion of the reinforcing metal member 10b being in close-contact with the molding resin portion 9 increases as illustrated in FIG. 5. Thus, it is possible to obtain an effect of reinforcing the portion bonded to the cooler 1 and reinforcing the outer shape of the molding resin portion 9 and to further improve the reliability of the semiconductor module unit.

Figure 6:
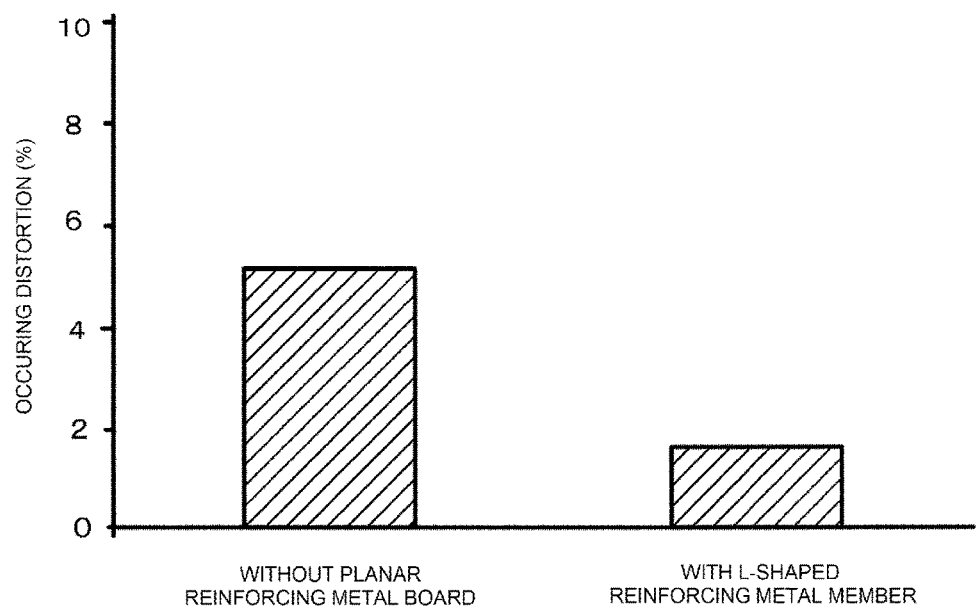
FIG. 6 is a bar graph illustrating the amount of distortion occurring in a solder bonding portion according to the second embodiment of the present invention.

FIG. 6 illustrates a bar graph illustrating the magnitude of stress (distortion) occurring in the solder bonding portion between the semiconductor module unit and the cooler in the semiconductor module having the reinforcing metal board 10a according to the first embodiment and the semiconductor module having the reinforcing metal member 10b having an L-shaped erected portion on the periphery according to the second embodiment. The stress (distortion) occurring in the planar reinforcing metal board 10a is approximately 5% whereas the stress (distortion) occurring in the reinforcing metal member 10b having the L-shaped erected portion is approximately 2%. Thus, the distortion of the bonding portion can be reduced further.

Figure 9:
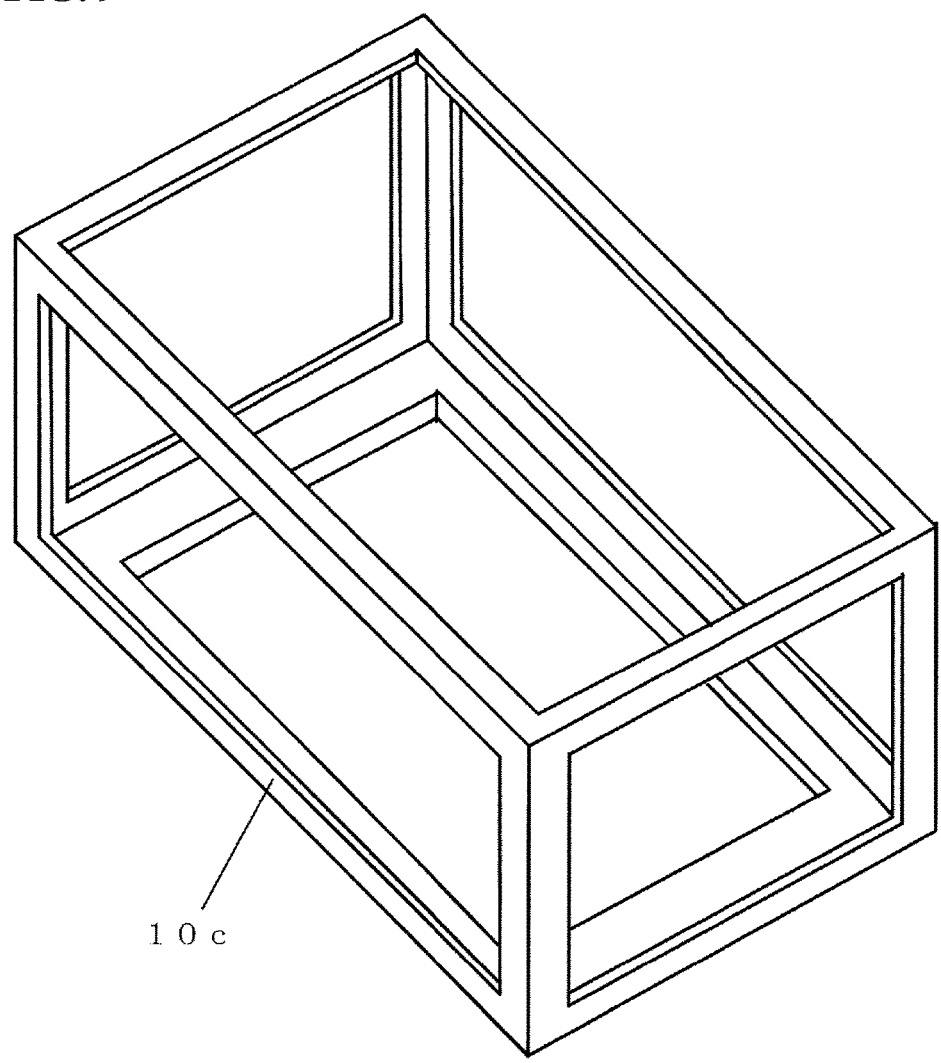
FIG. 9 is a perspective view illustrating another aspect of the reinforcing metal member according to the present invention.
Figure 10:
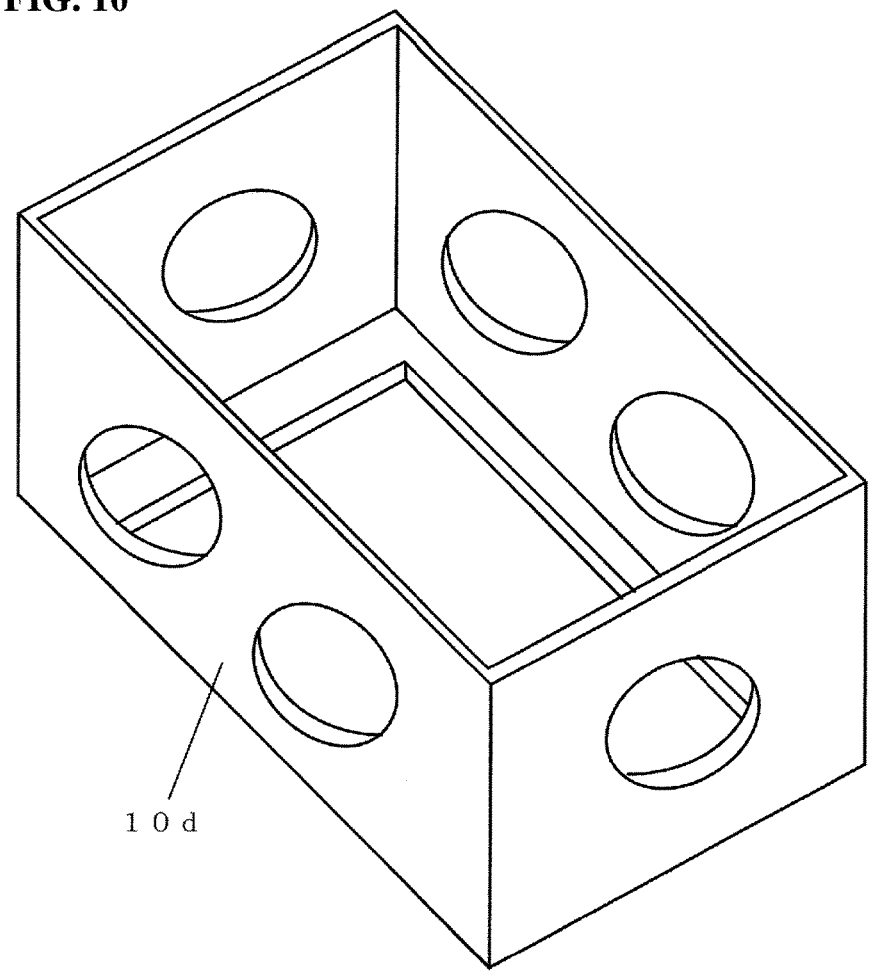
FIG. 10 is a perspective view illustrating still another aspect of the reinforcing metal member according to the present invention.

Thus, in order to reinforce the molding resin portion, the reinforcing metal member may preferably have such shapes as illustrated in the perspective views of FIGS. 8, 9, and 10. FIG. 8 illustrates a shape in which the outermost circumference of the planar reinforcing metal board 10a illustrated in FIG. 7 is erected vertically and stands up along the outer edge of the molding resin portion. The erecting height can be appropriately selected to be equal to or smaller than the height of the molding resin portion. FIG. 9 illustrates a shape that reinforces all sides of a rectangular parallelepiped molding resin portion using the planar reinforcing metal board 10a illustrated in FIG. 7 as a base. FIG. 10 illustrates a structure of a reinforcing metal member 10d having a shape obtained by punching planar portions of the reinforcing metal member 10b having the shape illustrated in FIG. 8 in order to reduce the weight. Although circular punched holes are formed in FIG. 10, the hole may not be circular.

Third Embodiment

Figure 11:
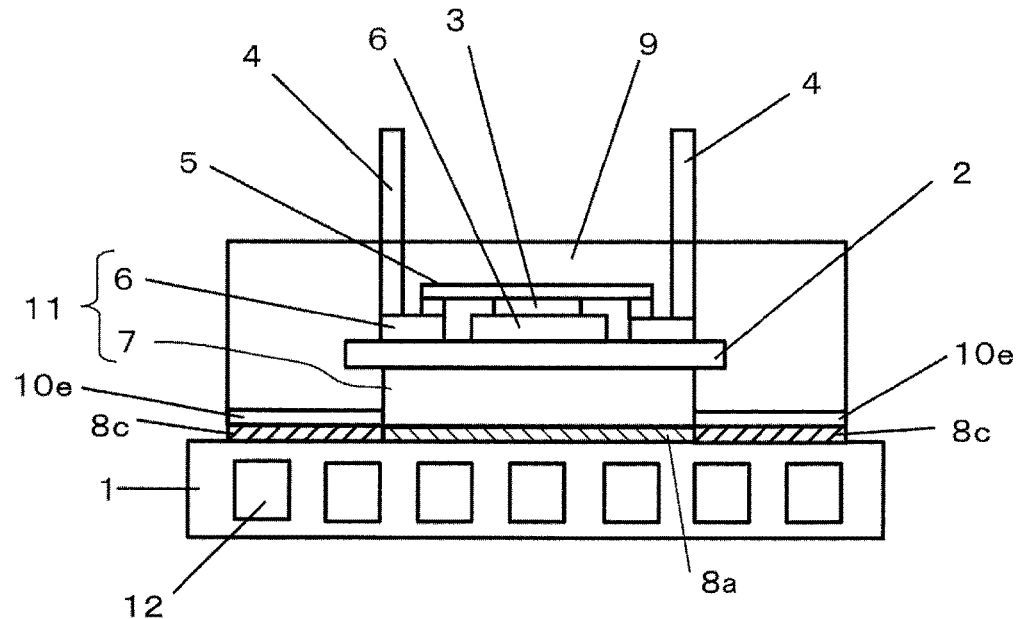
FIG. 11 is a cross-sectional view of a semiconductor module according to a third embodiment of the present invention.

A third embodiment of the semiconductor module according to the present invention will be described in detail with reference to the cross-sectional view of FIG. 11. The semiconductor module of the third embodiment is different from that of the first embodiment illustrated in FIG. 1 in that a second metal member 10e contacts the first metal member 7, and the second metal member 10e does not contact the insulating substrate 2. In order to secure a creepage insulation distance between the circuit member 6 and the second metal member 10e, the first metal member 7 is preferably thicker than that of FIG. 1 so as to increase the creepage insulation distance in a region in which the circuit member at the peripheral end of the insulating substrate is not formed. Various modified examples of the second metal members 10b to 10d illustrated in FIGS. 8 to 10 can be applied to the second metal member 10e of the third embodiment.

Fourth Embodiment

Figure 12:
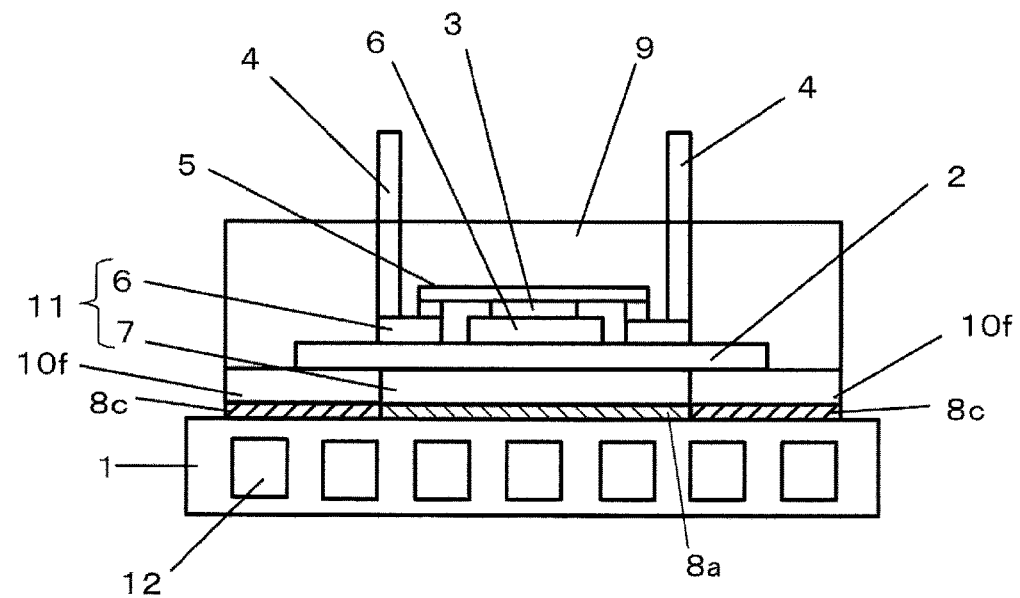
FIG. 12 is a cross-sectional view of a semiconductor module according to a fourth embodiment of the present invention.

A fourth embodiment of the semiconductor module according to the present invention will be described in detail with reference to the cross-sectional view of FIG. 12. The semiconductor layer of the fourth embodiment is different from that of the first embodiment illustrated in FIG. 1 in that a second metal member 10f contacts both the first metal member 7 and the insulating substrate 2. In order to secure a creepage insulation distance between the circuit member 6 and the second metal member 10f, it is preferable that the creepage insulation distance in a region in which the circuit member 6 at the peripheral end of the insulating substrate 2 is not formed is larger than that of the first and third embodiments. Various modified examples of the second metal members 10b to 10d illustrated in FIGS. 8 to 10 can be applied to the second metal member 10f of the fourth embodiment.

According to the first and second embodiments described above, a new reinforcing metal member in which a reinforcing metal board is disposed is provided in the lower surface of the ceramic board at the periphery of the insulating circuit board or the peripheral portion that surrounds the ceramic board, at which conventionally, the lower side of the molding resin portion 9 and the upper surface of the cooler 1 contact each other. Thus, it is possible to reinforce the solder bonding with the surface of the cooler 1. As a result, the bonding strength of the solder bonding portion in the exposed portion of the copper board under the insulating circuit board increases, the bonding distortion decreases, and the bonding reliability can be improved.

Moreover, the assembled semiconductor module units are screened based on an electrical characteristic test, and only non-defective products can be bonded to the cooler 1. Since only non-defective products are assembled, the yield rate is high. During bonding, since the semiconductor module unit and the cooler can be bonded by increasing a solder bonding region using solder similarly to the conventional technique, it is possible to provide a cooler-integrated power semiconductor module which can be manufactured by simple and efficient processes and which provides excellent heat radiation performance. Moreover, since a manufacturing method of manufacturing a small semiconductor module unit and then bonding the same to a cooler is used, it is possible to increase or decrease electrical capacity of the semiconductor module and to increase the degree of freedom of a circuit configuration in the semiconductor module unit. Thus, it is possible to provide a small semiconductor module unit having a high radiation performance and large current capacity and a cooler-integrated semiconductor module.

EXPLANATION OF REFERENCE NUMERALS

1: Cooler
2: Ceramic board (Insulating substrate)
3: Semiconductor chip
4: External leadout terminal
5: Lead frame
6: Circuit copper foil
7: Copper board (first metal member)
8a: First bonding member
8b: Second bonding member
8c: Second bonding member
9: Molding resin portion
10a: Reinforcing metal board (second metal member)
10b: Reinforcing metal member (second metal member)
10c: Reinforcing metal member (second metal member)
10d: Reinforcing metal member (second metal member)
10e: Reinforcing metal member (second metal member)
10f: Reinforcing metal member (second metal member)
11: Insulating circuit board
12: Hole through which coolant of cooler flows

What is claimed is:

1. A semiconductor module comprising:
   a semiconductor element;
   an insulating circuit board having an insulating substrate, a circuit member electrically connected to the semiconductor element and disposed on one principal surface of the insulating substrate, and a first metal member disposed on another principal surface of the insulating substrate arranged at a side opposite to the one principal surface;
   a second metal member, a portion of which is at least disposed outside the insulating substrate, continuously and entirely surrounding the insulating substrate with a space therebetween, the second metal member including a bottom portion and side portions extending from the bottom portion in a direction away from the cooler;
   a molding resin portion sealing the semiconductor element, the insulating circuit board, and the second metal member such that a bottom portion of the first metal member and the bottom portion of the second metal member are not covered by the molding resin, and the molding resin is interposed between the first metal member and the second metal member and is surrounded by the side portions of the second metal member;
   a cooler, wherein the bottom portion of the second metal member faces the cooler;
   a first bonding member bonding the cooler and the first metal member; and
   a second bonding member bonding the cooler and the second metal member and spaced from the first bonding member without the molding resin between the first bonding member and the second bonding member,
   wherein the second metal member is a frame forming an L shaped erected portion that reinforces an outer shape of the molding resin portion.

2. The semiconductor module according to claim 1, wherein a boundary of the first bonding member and a boundary of the second bonding member are connected on a principal surface of the cooler.

3. The semiconductor module according to claim 1, wherein the second metal member has projections and dents on a surface contacting the molding resin portion.

4. The semiconductor module according to claim 1, wherein the first bonding member and the second bonding member are metal bonding materials that do not contain lead and have different compositions.

5. The semiconductor module according to claim 1, wherein the second metal member has projections and dents on a surface contacting the second bonding member.

6. The semiconductor module according to claim 5, wherein the first bonding member is a metal bonding material that does not contain lead, and the second bonding member is a thermoplastic resin or a thermosetting resin.

7. The semiconductor module according to claim 1, wherein the first bonding member is a member in which silver particles are sintered.

8. The semiconductor module according to claim 1, wherein at least one metal layer selected from the group consisting of a nickel-plating layer, a gold-plating layer, a silver-plating layer, a tin-plating layer, and a copper-plating layer is provided on a surface of the second metal member contacting the second bonding member.

9. The semiconductor module according to claim 1, wherein at least one metal layer selected from the group consisting of a nickel-plating layer, a gold-plating layer, a silver-plating layer, a tin-plating layer, and a copper-plating layer is provided on a surface of the cooler contacting the second bonding member.

10. The semiconductor module according to claim 1, wherein at least one metal layer selected from the group consisting of a gold-plating layer and a silver-plating layer is provided in a portion of the cooler contacting the first bonding member and a portion of the first metal member contacting the first bonding member.

11. The semiconductor module according to claim 1, wherein the insulating substrate is a ceramic board including at least one ceramic material selected from the group consisting of aluminum oxides, silicon nitrides, and aluminum nitrides.

12. The semiconductor module according to claim 1, wherein the second metal member includes at least one material selected from the group consisting of copper, copper alloys, aluminum, and aluminum alloys.

13. The semiconductor module according to claim 1 wherein a lower surface of the first metal member and a lower surface of the second metal member are flush with each other with the molding resin therebetween, and a space is formed between the first metal member and the second metal member under the molding resin.

* * * * *